United States Patent
Chen

(10) Patent No.: US 9,704,983 B2
(45) Date of Patent: *Jul. 11, 2017

(54) LATERAL MOSFET WITH DIELECTRIC ISOLATION TRENCH

(71) Applicant: Taiwan Semiconductor Manufacturing Company, Ltd., Hsin-Chu (TW)

(72) Inventor: Po-Yu Chen, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/852,049

(22) Filed: Sep. 11, 2015

(65) Prior Publication Data

US 2016/0005855 A1    Jan. 7, 2016

Related U.S. Application Data

(63) Continuation of application No. 13/415,965, filed on Mar. 9, 2012, now Pat. No. 9,136,158.

(51) Int. Cl.
*H01L 29/78* (2006.01)
*H01L 21/762* (2006.01)
(Continued)

(52) U.S. Cl.
CPC .... *H01L 29/7809* (2013.01); *H01L 21/26513* (2013.01); *H01L 21/76232* (2013.01); *H01L 21/76283* (2013.01); *H01L 27/1203* (2013.01); *H01L 29/0653* (2013.01); *H01L 29/0865* (2013.01); *H01L 29/0882* (2013.01); *H01L 29/1037* (2013.01); *H01L 29/1095* (2013.01);
(Continued)

(58) Field of Classification Search
CPC .......... H01L 29/4236; H01L 29/66659; H01L 29/66689; H01L 29/66704; H01L 29/7809; H01L 29/7813
See application file for complete search history.

(56) References Cited

U.S. PATENT DOCUMENTS

| | | | |
|---|---|---|---|
| 6,177,704 B1 * | 1/2001 | Suzuki | ............... H01L 27/1203 257/329 |
| 8,716,794 B2 | 5/2014 | Luo et al. | |
| 2001/0038125 A1 | 11/2001 | Ohyanagi et al. | |

FOREIGN PATENT DOCUMENTS

| | | |
|---|---|---|
| CN | 101840935 A | 9/2010 |
| WO | 2011143848 A1 | 11/2011 |

* cited by examiner

*Primary Examiner* — Matthew Landau
*Assistant Examiner* — Scott Stowe
(74) *Attorney, Agent, or Firm* — Slater Matsil, LLP

(57) ABSTRACT

A lateral trench MOSFET comprises an insulating layer buried in a substrate, a body region in the substrate, an isolation region in the substrate, a first drain/source region over the body region, a second drain/source region in the substrate, wherein the first drain/source region and the second drain/source region are on opposing sides of the isolation region, a drift region comprising a first drift region of a first doping density formed between the second drain/source region and the insulating layer, wherein the first drift region comprises an upper portion surrounded by isolation regions and a lower portion and a second drift region of a second doping density formed between the isolation region and the insulating layer, wherein a height of the second drift region is equal to a height of the lower portion of the first drift region.

18 Claims, 16 Drawing Sheets

(51) Int. Cl.
    *H01L 29/786*   (2006.01)
    *H01L 29/66*    (2006.01)
    *H01L 29/06*    (2006.01)
    *H01L 21/265*   (2006.01)
    *H01L 27/12*    (2006.01)
    *H01L 29/08*    (2006.01)
    *H01L 29/10*    (2006.01)

(52) U.S. Cl.
    CPC .. *H01L 29/66704* (2013.01); *H01L 29/66712* (2013.01); *H01L 29/66734* (2013.01); *H01L 29/7812* (2013.01); *H01L 29/7813* (2013.01); *H01L 29/7824* (2013.01); *H01L 29/7825* (2013.01); *H01L 29/78642* (2013.01)

LATERAL MOSFET WITH DIELECTRIC ISOLATION TRENCH

This application is a continuation of U.S. patent application Ser. No. 13/415,965, entitled "Lateral MOSFET with Dielectric Isolation Trench," filed on Mar. 9, 2012, which application is incorporated herein by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are needed to maintain the electronic components' performance from one generation to the next. For example, low gate-to-drain capacitance, low on-resistance and high breakdown voltage of transistors are desirable for high power applications.

As semiconductor technologies evolve, metal oxide semiconductor field effect transistors (MOSFET) have been widely used in today's integrated circuits. MOSFETs are voltage controlled devices. When a control voltage is applied to the gate of a MOSFET and the control voltage is greater than the threshold of the MOSFET, a conductive channel is established between the drain and the source of the MOSFET. As a result, a current flows between the drain and the source of the MOSFET. On the other hand, when the control voltage is less than the threshold of the MOSFET, the MOSFET is turned off accordingly.

MOSFETs may include two major categories. One is n-channel MOSFETs; the other is p-channel MOSFETs. According to the structure difference, MOSFETs can be further divided into three sub-categories, planar MOSFETs, lateral double diffused MOS (LDMOS) FETs and vertical double diffused MOSFETs. In comparison with other MOSFETs, the LDMOS is capable of delivering more current per unit area because its asymmetric structure provides a short channel between the drain and the source of the LDMOS.

In order to further improve the performance of the LDMOS, an isolation trench may be added into a lateral MOSFET to increase the breakdown voltage of the lateral MOSFET. In particular, the gate region, the channel region and the drift region of the lateral MOSFET are formed along the sidewall of the isolation trench. Such a lateral trench MOSFET structure helps to reduce the on-resistance as well as increase the breakdown voltage of lateral MOSFETs.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a lateral metal oxide semiconductor field effect transistor (MOSFET) with a dielectric isolation trench. The embodiments of the disclosure may also be applied, however, to a variety of metal oxide semiconductor transistors.

Figure 1:
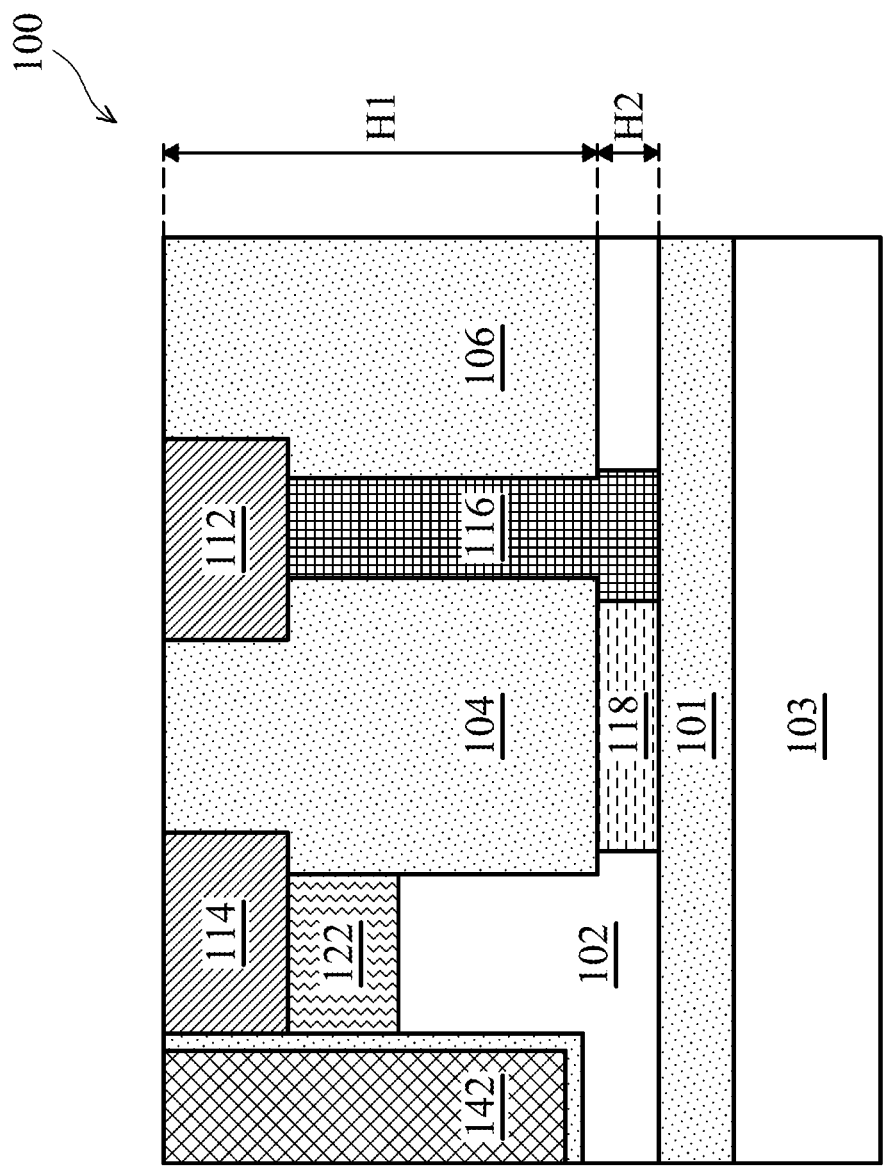
FIG. 1 illustrates a simplified cross-sectional view of a lateral trench MOSFET in accordance with an embodiment.

FIG. 1 illustrates a simplified cross-sectional view of a lateral trench MOSFET in accordance with an embodiment. The lateral trench MOSFET 100 includes a substrate with a first conductivity and an insulating layer 101 buried in the substrate. More particularly, the substrate can be divided into two portions. As shown in FIG. 1, an upper substrate portion 102 is formed over the insulating layer 101; a lower substrate portion 103 is formed below the insulating layer 101. In accordance with an embodiment, the insulating layer 101 is formed of silicon dioxide. The substrate may be a lightly doped n-type substrate, which is formed by implanting n-type dopants such as phosphorous at a concentration of between about $5 \times 10^{16}/cm^3$ and about $9 \times 10^{16}/cm^3$. The substrate shown in FIG. 1 is commonly referred to as a silicon-on-insulator substrate.

A first drain/source region 112 and a second drain/source region 114 are formed in the upper substrate portion 102 over the insulating layer 101. Isolation regions 104 and 106 are formed between two active regions. For example, as shown in FIG. 1, the isolation region 104 is formed between the first drain/source region 112 and the second drain/source region 114. In accordance with an embodiment, the first drain/source region 112 is a drain of the lateral trench MOSFET 100 and the second drain/source region 114 is a source of the lateral trench MOSFET 100.

The first drain/source region 112 is formed in the upper substrate portion 102. In accordance with an embodiment, the first drain/source region 112 functions as a drain of the lateral trench MOSFET 100. The first drain/source region 112 may be formed of n-type dopants. The drain region may be formed by implanting an n-type dopant such as phosphorous at a concentration of between about $1 \times 10^{19}/cm^3$ and about $5 \times 10^{19}/cm^3$.

The second drain/source region 114 is formed in a body region 122. In accordance with an embodiment, the second drain/source region 114 may be a source of the lateral trench MOSFET 100. The source region may be formed by implanting an n-type dopant such as phosphorous at a concentration of between about $1 \times 10^{19}/cm^3$ and about $5 \times 10^{19}/cm^3$. As shown in FIG. 1, the source region is formed adjacent to the isolation region 104 on the opposite side from the drain (the first drain/source region 112).

The lateral trench MOSFET 100 further comprises the body region 122 with a second conductivity formed in the upper substrate portion 102 over the insulating layer 101. As shown in FIG. 1, the body region 122 is formed underneath the second drain/source region 114. In accordance with an embodiment, when the substrate is n-type, the body region 122 is a p-type body region. The body region 122 is formed by implanting p-type doping materials such as boron, gallium, aluminum, indium, combinations thereof, or the like. In accordance with an embodiment, a p-type material such as boron may be implanted to a doping density of about $10^{17}/cm^3$ to $3 \times 10^{18}/cm^3$. Alternatively, the body region 122 can be formed by a diffusion process. The body region 122 of the lateral trench MOSFET 100 may be alternatively referred to as a channel region.

The lateral trench MOSFET 100 may comprise a gate 142. As shown in FIG. 1, the gate 142 is enclosed by a dielectric layer. In particular, the dielectric layer separates the gate 142 from the second drain/source region 114. In accordance with an embodiment, the gate 142 may be coupled to a control signal. When the control signal is greater than the threshold voltage of the lateral trench MOSFET 100, the lateral trench MOSFET 100 is turned on. On the other hand, when the control signal is less than the threshold voltage, the lateral trench MOSFET 100 is turned off accordingly.

The lateral trench MOSFET 100 may comprise a drift region comprising a first drift region 116 formed between the first drain/source region 112 and the insulating layer 101 and a second drift region 118 formed between the isolation region 104 and the insulating layer 101. In accordance with an embodiment, the first drift region 116 is an n-type region having a doping concentration in a range from about $10^{17}/cm^3$ to about $5 \times 10^{17}/cm^3$. The second drift region 118 is an n-type region having a doping concentration in a range from about $10^{16}/cm^3$ to about $3 \times 10^{17}/cm^3$.

The dimensions of the depth of the isolation region 104 and the gap between isolation region 104 and the insulating layer 101 are shown in FIG. 1. In particular, the depth of the isolation region 104 is defined as H1. The gap between the isolation region 104 and the insulating layer 101 is defined as H2. In accordance with an embodiment, H1 is approximately equal to 1 um. H2 is in a range from about 0.05 um to about 0.3 um.

One skilled in the art will recognize that FIG. 1 illustrates an ideal profile. The dimensions of H1 and H2 may vary after subsequent fabrication processes. H1 and H2 shown in FIG. 1 are used to illustrate the inventive aspects of the various embodiments. The disclosure is not limited to any particular dimensions of H1 and H2.

The isolation regions (e.g., isolation region 104) are used to improve the breakdown voltage of the lateral trench MOSFET 100. In particular, as shown in FIG. 1, the bottom surface of the isolation region 104 is adjacent to the insulating layer 101. Both the insulating layer 101 and the isolation region 104 are formed of dielectric materials such as silicon dioxide. The proximity between two silicon dioxide layers may lead to a fully depleted second drift region 118. Such a fully depleted drift region helps to reduce the electric field at the surface of the lateral trench MOSFET 100 during off-state. Likewise, the first drift region 116 may be fully depleted because it is located between two silicon dioxide regions 104 and 106. As such, the fully depleted second drift region 116 helps to reduce the electric filed at the surface of the lateral trench MOSFET 100.

The influence of the fully depleted drift region (e.g., second drift region 118) is similar to the effect of reduced surface field (RESURF). RESURF is a well-known mechanism to improve the breakdown voltage of high voltage MOSFETs. As such, the fully depleted drift regions can help to improve the breakdown voltage of the lateral trench MOSFET 100. Moreover, because the breakdown voltage of the lateral trench MOSFET 100 is improved, a highly doped drift region may be employed to further reduce the on-resistance of the lateral trench MOSFET 100. In sum, the fully depleted drift region 118 helps to improve the breakdown voltage as well as the on-resistance of the lateral trench MOSFET 100.

One advantageous feature of a lateral trench MOSFET with a dielectric isolation trench (e.g., isolation region 104) is that the trench structure shown in FIG. 1 helps to improve the breakdown voltage as well as the on-resistance of the lateral trench MOSFET 100. In other words, the trench structure helps to maintain the breakdown voltage of a lateral trench MOSFET. In addition, the trench structure can reduce the on-resistance of the lateral trench MOSFET 100 so that the power losses of the lateral trench MOSFET 100 may be reduced. Furthermore, the lateral trench structure of FIG. 1 may help to reduce the pitch of the lateral trench MOSFET 100. Such a reduced pitch may help to reduce the channel length as well as the turn-on resistance of the lateral trench MOSFET 100.

Figure 2:
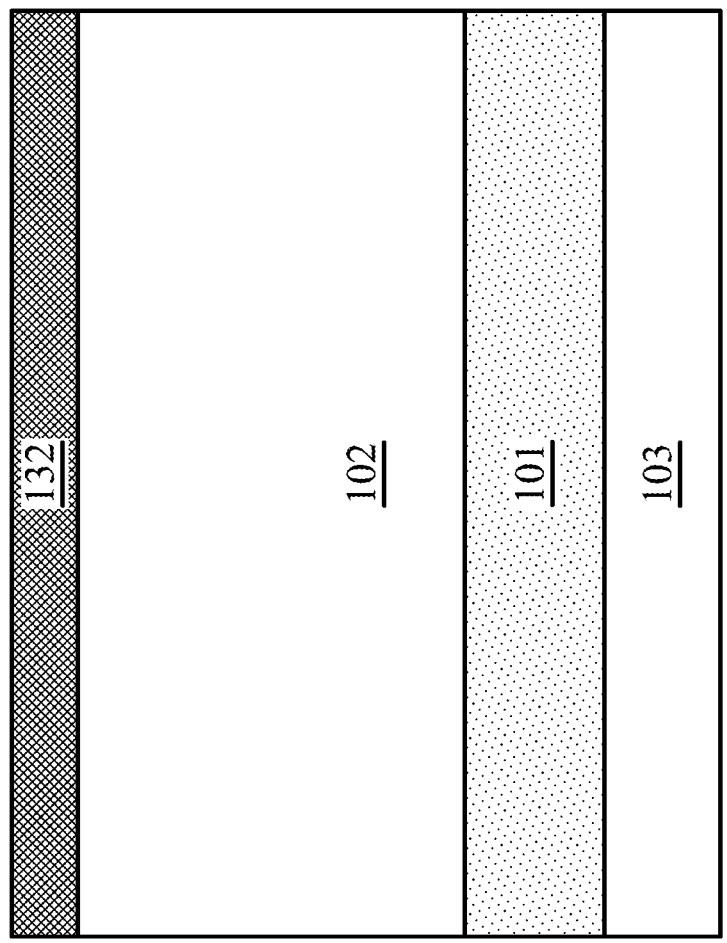
FIG. 2 illustrates a cross section view of a semiconductor device after a dielectric layer is applied to the substrate in accordance with an embodiment.

FIGS. 2-15 illustrates cross section views of intermediate steps of fabricating a lateral trench MOSFET in accordance with an embodiment. FIG. 2 illustrates a cross section view of a semiconductor device after a dielectric layer is applied to the substrate in accordance with an embodiment. As shown in FIG. 2, a dielectric layer 132 is formed on top of an upper substrate portion 102 over an insulating layer 101. As described above with reference to FIG. 1, the substrate may be an n-type SOI substrate.

The dielectric layer 132 may be formed of various dielectric materials commonly used in integrated circuit fabrication. For example, the dielectric layer 132 may be formed of silicon dioxide, silicon nitride or a doped glass layer such as boron silicate glass and the like. Alternatively, dielectric layer may be a layer of silicon nitride, a silicon oxynitride layer, a polyamide layer, a low dielectric constant insulator or the like. In addition, a combination of the foregoing dielectric materials may also be used to form the dielectric layer 132. In accordance with an embodiment, the dielectric layer 132 may be formed using suitable techniques such as sputtering, oxidation and/or chemical vapor deposition (CVD).

Figure 3:
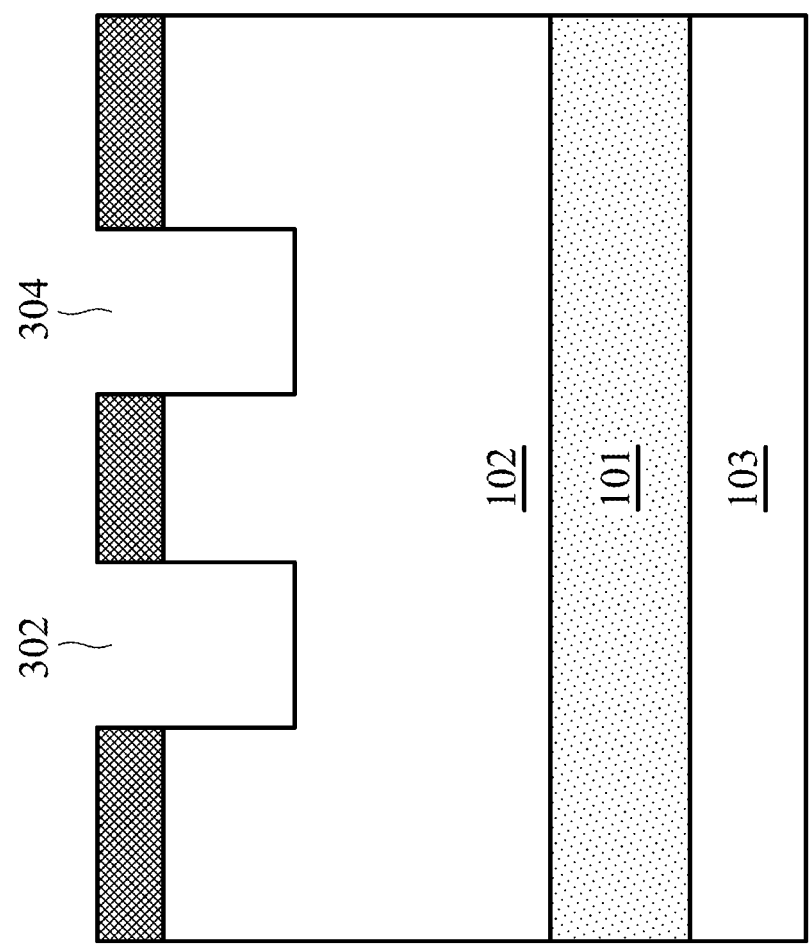
FIG. 3 illustrates a cross section view of the semiconductor device shown in FIG. 2 after an etching process is applied to the semiconductor device in accordance with an embodiment.

FIG. 3 illustrates a cross section view of the semiconductor device shown in FIG. 2 after an etching process is applied to the semiconductor device in accordance with an embodiment. In accordance with an embodiment, a patterned mask (not shown), such as a photoresist mask and/or a hard mask, is formed on the dielectric layer 132 using deposition and photolithography techniques. Thereafter, an etching process, such as a reactive ion etch (RIE) or other dry etch, an anisotropic wet etch, or any other suitable anisotropic etch or patterning process, is performed to form trenches 302 and 304.

Figure 4:
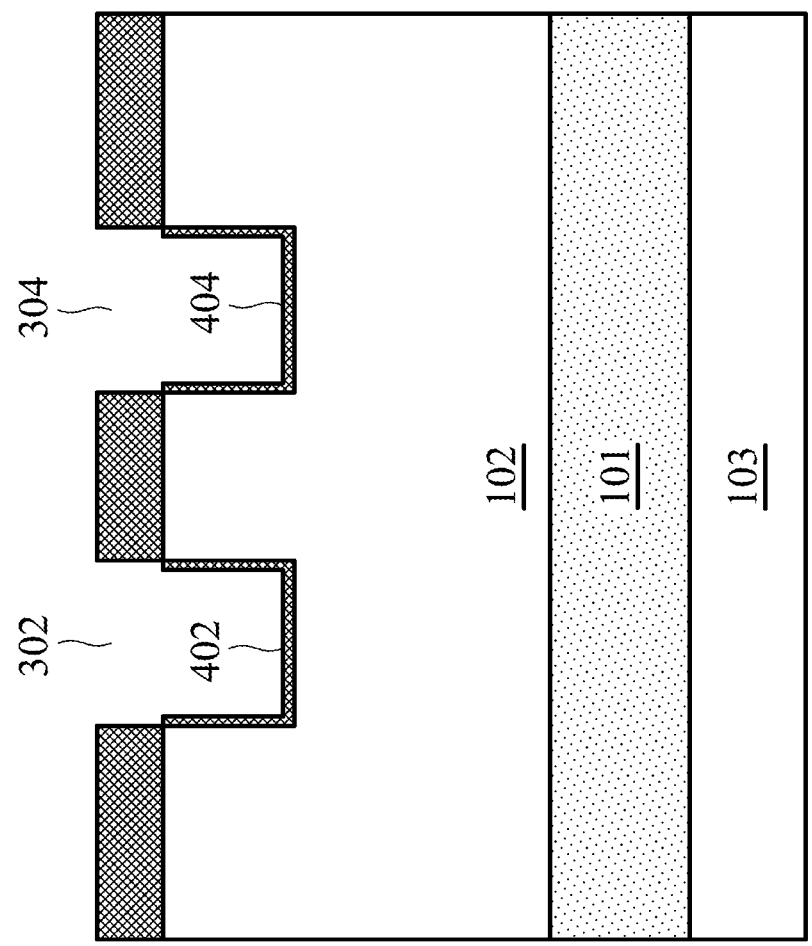
FIG. 4 illustrates a cross section view of the semiconductor device shown in FIG. 3 after a thin dielectric layer is formed in the trench 302 and the trench 304 in accordance with an embodiment.

FIG. 4 illustrates a cross section view of the semiconductor device shown in FIG. 3 after a thin dielectric layer is formed in the trench 302 and the trench 304 in accordance with an embodiment. The thin dielectric layers 402 and 404 may be may be an oxide layer thermally grown in the trench 302 and the trench 304 respectively. Alternatively, the thin dielectric layers 402 and 404 can be formed by other suitable techniques such as sputtering, oxidation and/or CVD.

Figure 5A:
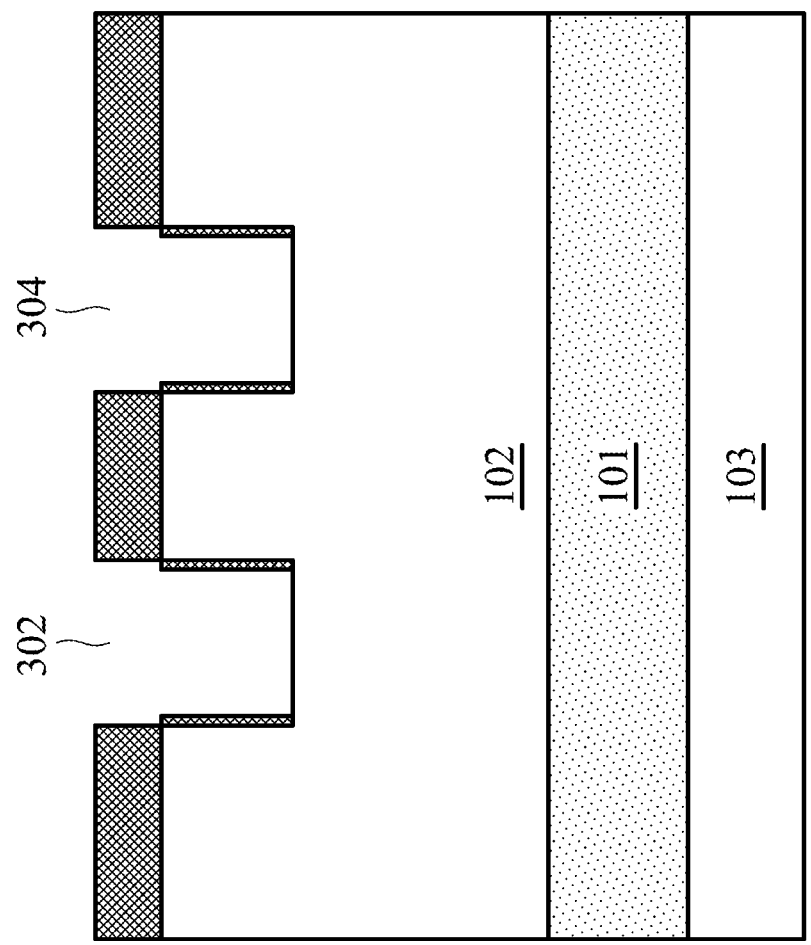
FIG. 5A illustrates a cross section view of the semiconductor device shown in FIG. 4 after an anisotropic etching process is applied to the trench 302 and the trench 304 in accordance with an embodiment.

FIG. 5A illustrates a cross section view of the semiconductor device shown in FIG. 4 after an anisotropic etching process is applied to the trench 302 and the trench 304 in accordance with an embodiment. An anisotropic etching process is applied to the trench 302 and the trench 304. By controlling the strength and direction of the etching process, the bottom of the thin dielectric layers 402 and 404 have been removed as a result.

Figure 5B:
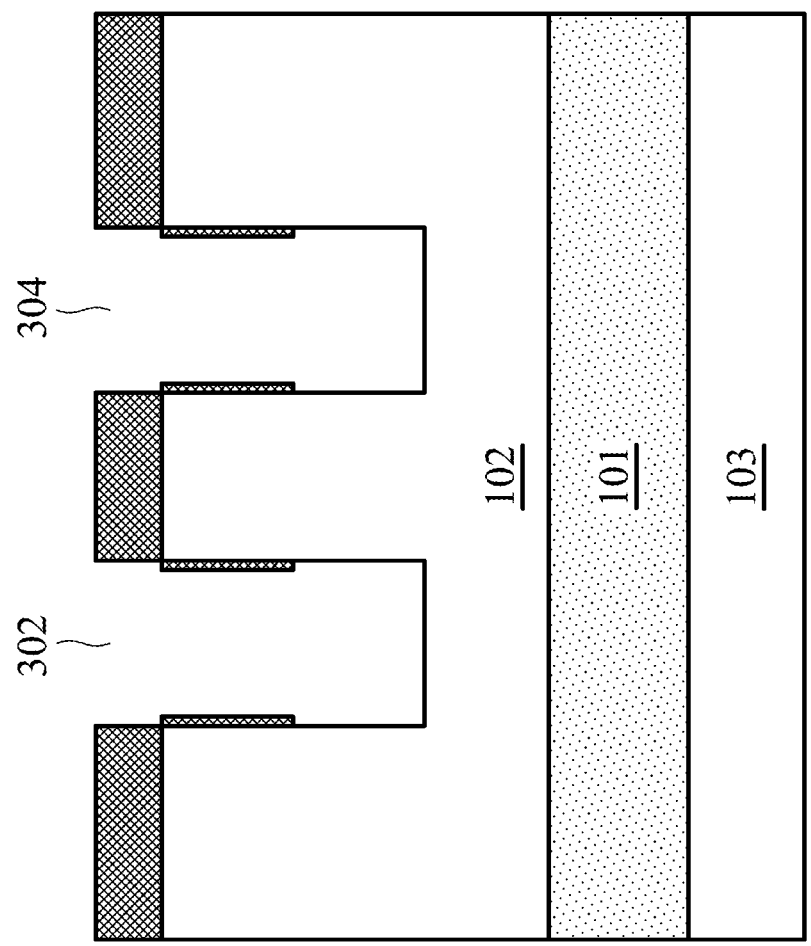
FIG. 5B illustrates a cross section view of the semiconductor device shown in FIG. 5A after an extra anisotropic etching process is applied to the trench 302 and the trench 304 in accordance with an embodiment.

FIG. 5B illustrates a cross section view of the semiconductor device shown in FIG. 5A after an extra anisotropic etching process is applied to the trench 302 and the trench 304 in accordance with an embodiment. An extra anisotropic etching process is applied to the trench 302 and the trench 304. By controlling the strength and direction of the extra etching process, as shown in FIG. 5B, the bottom portions of the dielectric sidewalls of the trench 302 and the trench 304 have been removed as a result.

Figure 6:
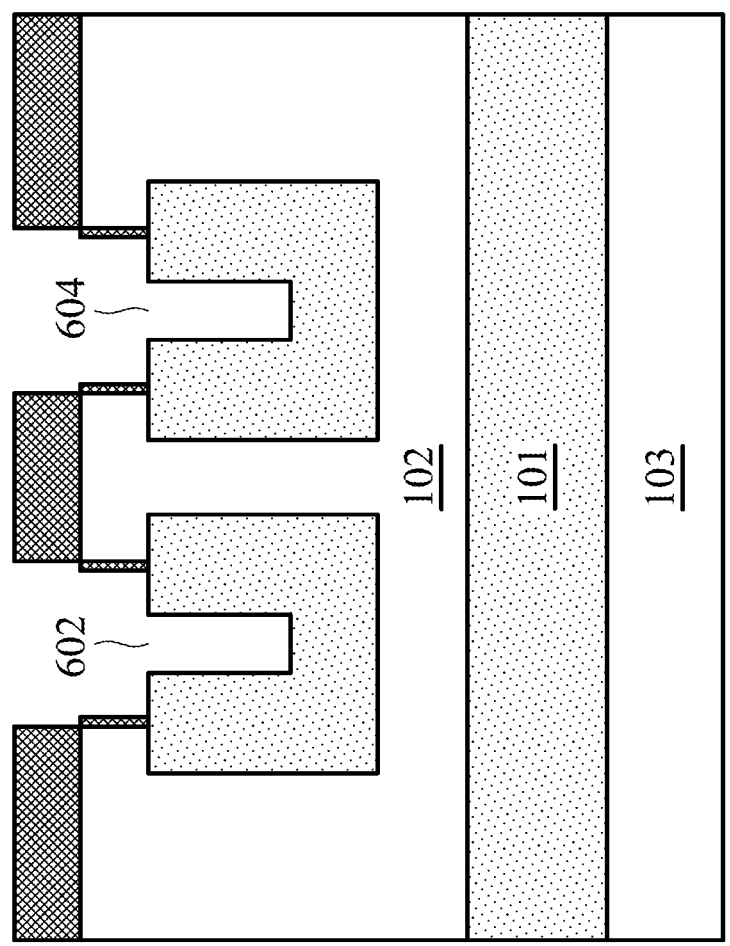
FIG. 6 illustrates a cross section view of the semiconductor device shown in FIG. 5B after bottom dielectric layers are formed at the bottoms of the trench 304 and the trench 304 respectively in accordance with an embodiment.

FIG. 6 illustrates a cross section view of the semiconductor device shown in FIG. 5B after bottom dielectric layers are formed at the bottoms of the trench 304 and the trench 304 respectively in accordance with an embodiment. The bottom dielectric layers 602 and 604 may be an oxide layer thermally grown in the trenches 302 and 304 respectively. It should be noted that the bottom dielectric layers 602 and 604 can be formed by other suitable techniques such as CVD.

Figure 7:
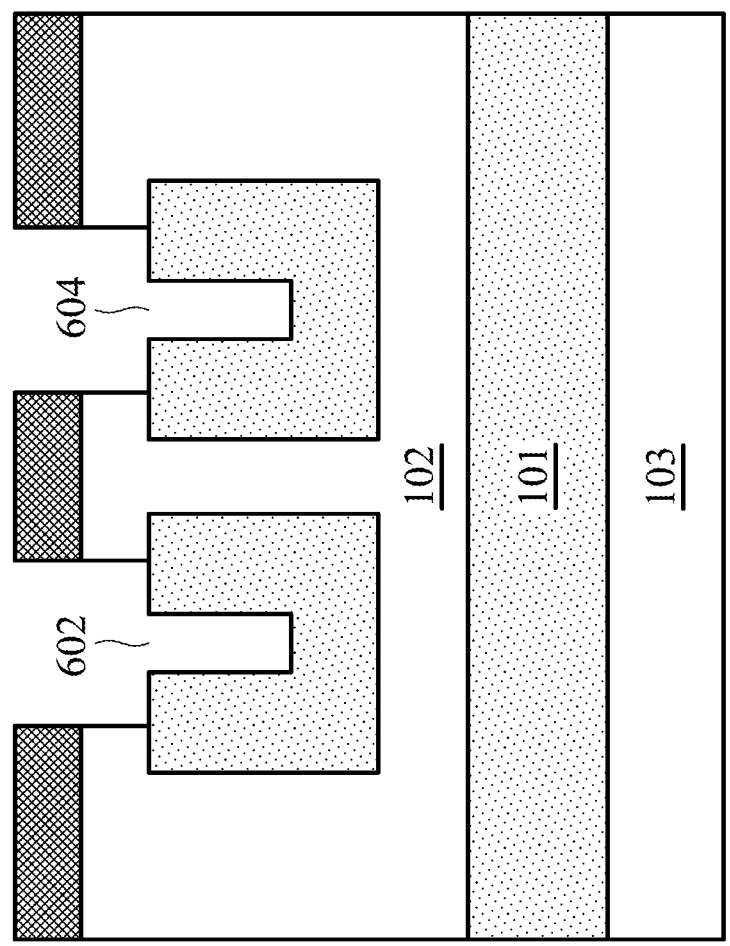
FIG. 7 illustrates a cross section view of the semiconductor device shown in FIG. 6 after an isotropic etching process is applied to the trench 302 and the trench 304 respectively in accordance with an embodiment.

FIG. 7 illustrates a cross section view of the semiconductor device shown in FIG. 6 after an isotropic etching process is applied to the trench 302 and the trench 304 respectively in accordance with an embodiment. An anisotropic etching process is applied to the trench 302 and the trench 304. The thin liner dielectric layers on the sidewalls of the trench 302 and the trench 304 have been removed as a result.

Figure 8:
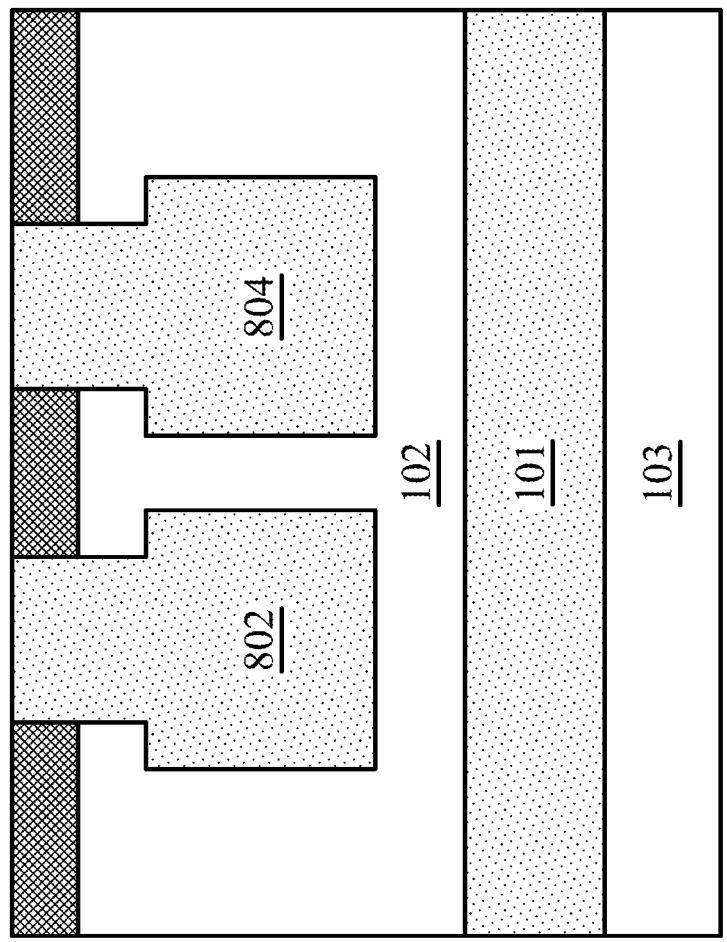
FIG. 8 illustrates a cross section view of the semiconductor device shown in FIG. 7 after dielectric materials are filled into the trenches shown in FIG. 7 in accordance with an embodiment.

FIG. 8 illustrates a cross section view of the semiconductor device shown in FIG. 7 after dielectric materials are filled into the trenches shown in FIG. 7 in accordance with an embodiment. In accordance with an embodiment, the isolation regions 802 and 804 may be formed by first forming trenches and then filling the trenches with a dielectric material. In order to polish the surface of the semiconductor device shown in FIG. 8, a planarization process, such as CMP or etch back step, may be performed to planarize an upper surface of the isolation regions 802 and 804.

The trenches (shown in FIG. 7) are filled with a dielectric material thereby forming the isolation regions 802 and 804 as illustrated in FIG. 8. The dielectric material may comprise, for example, a thermal oxidation, a CVD silicon oxide or the like. It may also comprise a combination of materials, such as silicon nitride, silicon oxy-nitride, high-k dielectrics, low-k dielectrics, CVD poly-silicon or other dielectrics.

Figure 9:
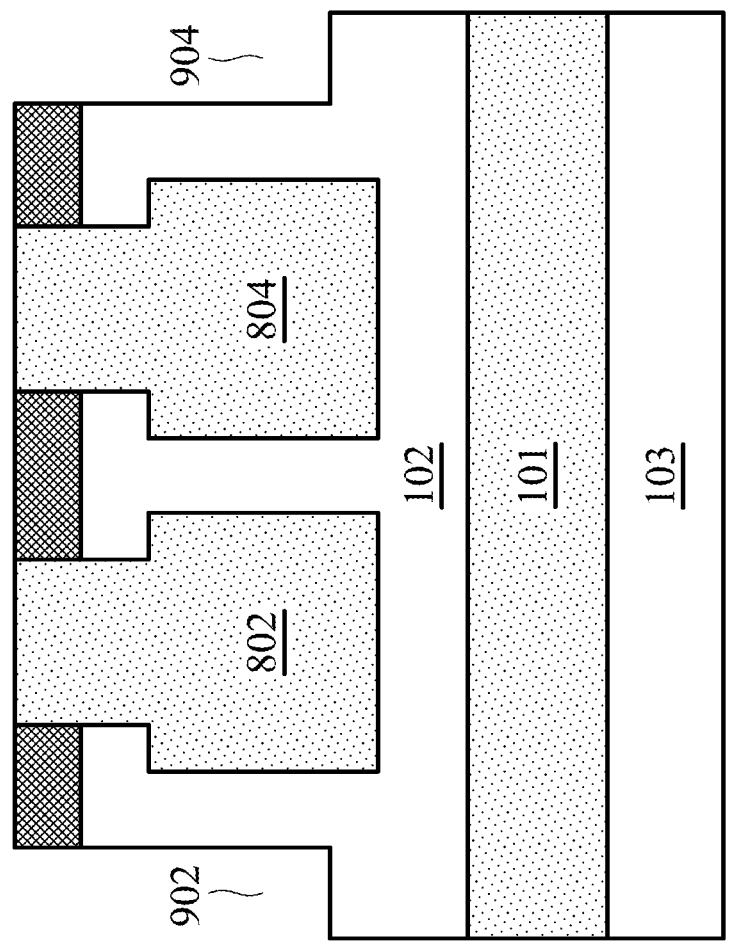
FIG. 9 illustrates a cross section view of the semiconductor device shown in FIG. 8 after an anisotropic etching process is applied to the semiconductor device shown in FIG. 8 in accordance with an embodiment.

FIG. 9 illustrates a cross section view of the semiconductor device shown in FIG. 8 after an anisotropic etching process is applied to the semiconductor device shown in FIG. 8 in accordance with an embodiment. A patterned mask (not shown), such as a photoresist mask and/or a hard mask, is formed on the top surface of the semiconductor device using deposition and photolithography techniques. An anisotropic etching process is performed to form trenches 902 and 904.

Figure 10:
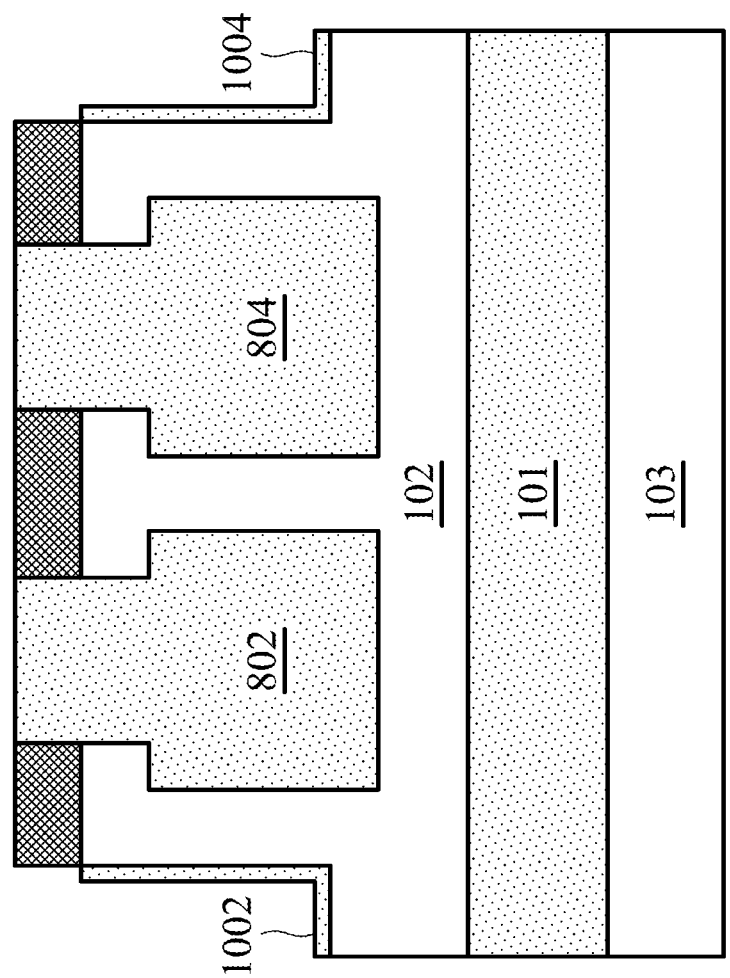
FIG. 10 illustrates a cross section view of the semiconductor device shown in FIG. 9 after a thin liner oxide layer is formed on the sidewalls of the trench shown in FIG. 9 in accordance with an embodiment.

FIG. 10 illustrates a cross section view of the semiconductor device shown in FIG. 9 after a thin liner oxide layer is formed on the sidewalls of the trench shown in FIG. 9 in accordance with an embodiment. The thin oxide layer may be thermally grown in the trenches 902 and 904. The dielectric layer on the top surface prevents any additional oxidation on the top surface of the semiconductor device.

Figure 11:
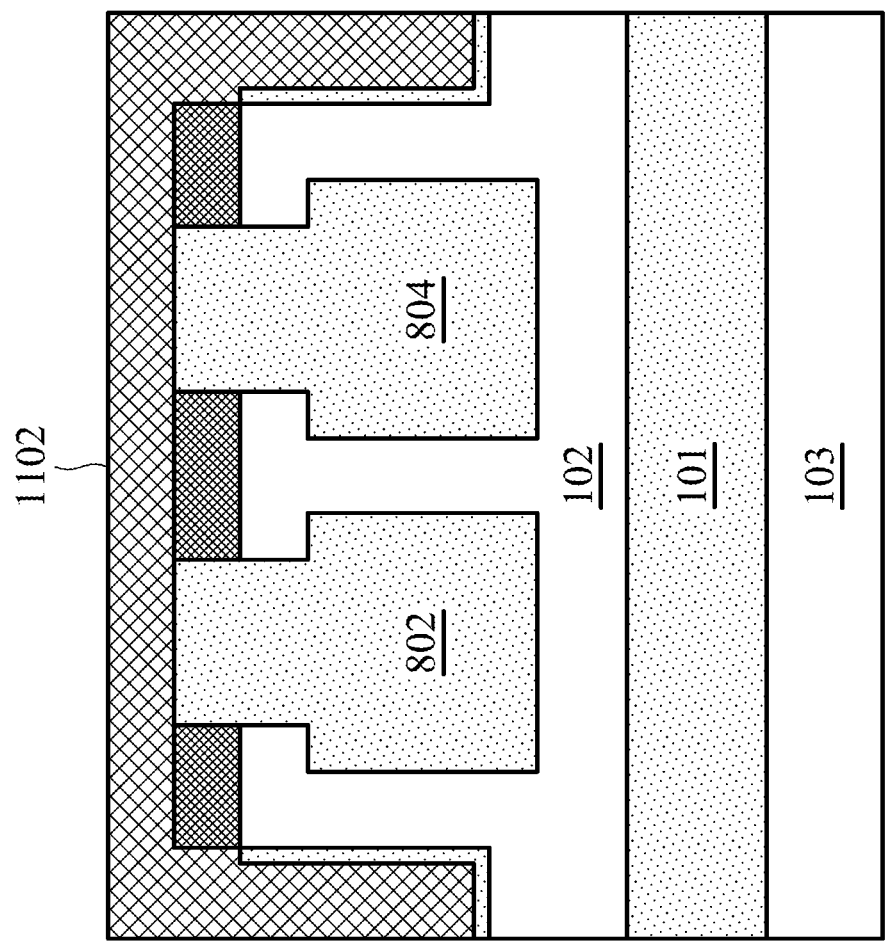
FIG. 11 illustrates a cross section view of the semiconductor device shown in FIG. 10 after a gate electrode material is filled in the trenches in accordance with an embodiment.

FIG. 11 illustrates a cross section view of the semiconductor device shown in FIG. 10 after a gate electrode material is filled in the trenches in accordance with an embodiment. The gate electrode layer 1102 may be formed of polysilicon. Alternatively, the gate electrode layer 1102 may be formed of other commonly used conductive materials such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like.

Figure 12:
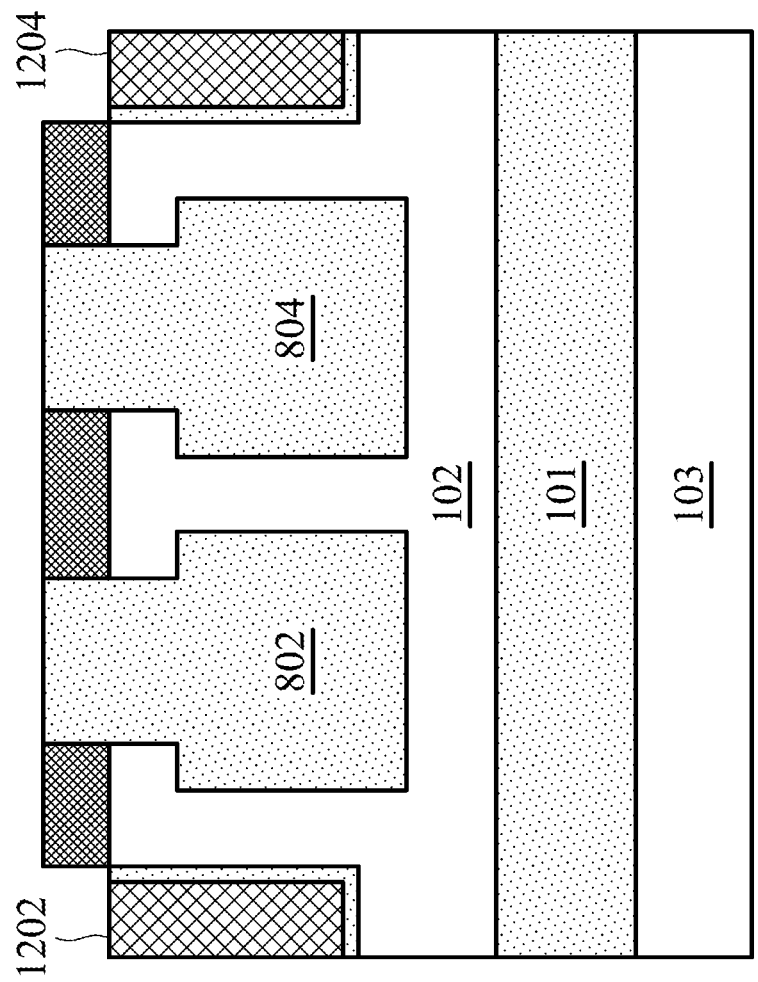
FIG. 12 illustrates a cross section view of the semiconductor device shown in FIG. 11 after a chemical mechanical polish (CMP) process or an etch-back process is applied to the top surface shown in FIG. 11 in accordance with an embodiment.

FIG. 12 illustrates a cross section view of the semiconductor device shown in FIG. 11 after a chemical mechanical polish (CMP) process or an etch-back process is applied to the top surface shown in FIG. 11 in accordance with an embodiment. A planarization process, such as CMP or etch back step, may be performed to planarize an upper surface of the gate electrode layer 1102. As shown in FIG. 12, a portion of the gate electrode layer 1102 has been removed as a result. As shown in FIG. 12, there may be two gates after the CMP process, namely a first gate 1202 and a second gate 1204.

Figure 13:
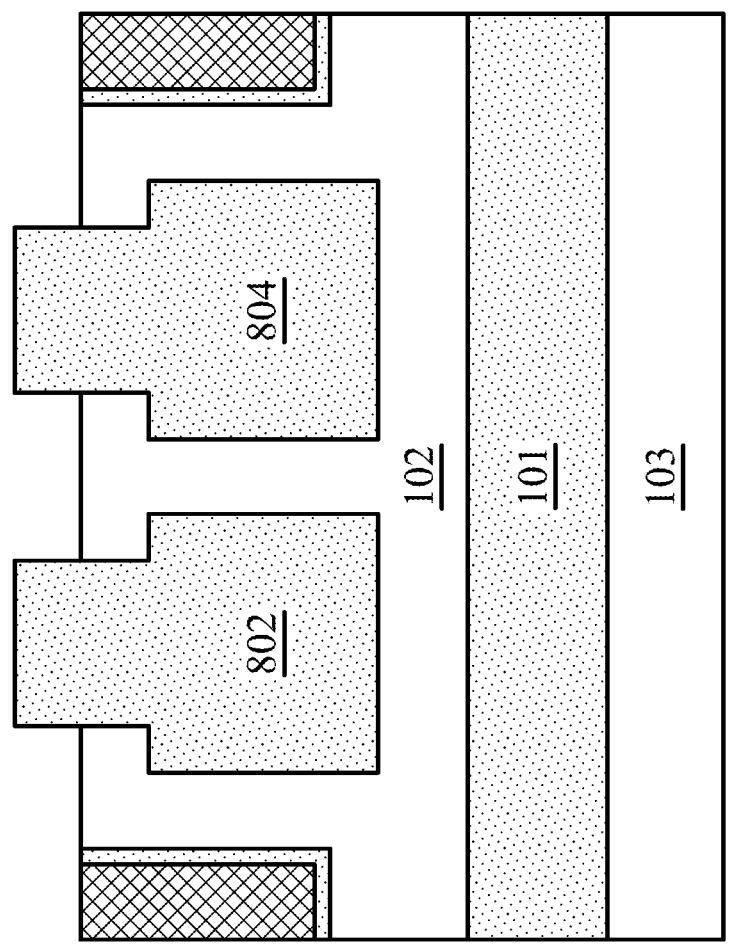
FIG. 13 illustrates a cross section view of the semiconductor device shown in FIG. 12 after an anisotropic etching process is applied to the top surface of the semiconductor device in accordance with an embodiment.

FIG. 13 illustrates a cross section view of the semiconductor device shown in FIG. 12 after an anisotropic etching process is applied to the top surface of the semiconductor device in accordance with an embodiment. An anisotropic etching process is applied to the top surface in accordance with an embodiment. As a result, the dielectric layer 132 (not shown but illustrated in FIG. 2) has been removed.

Figure 14:
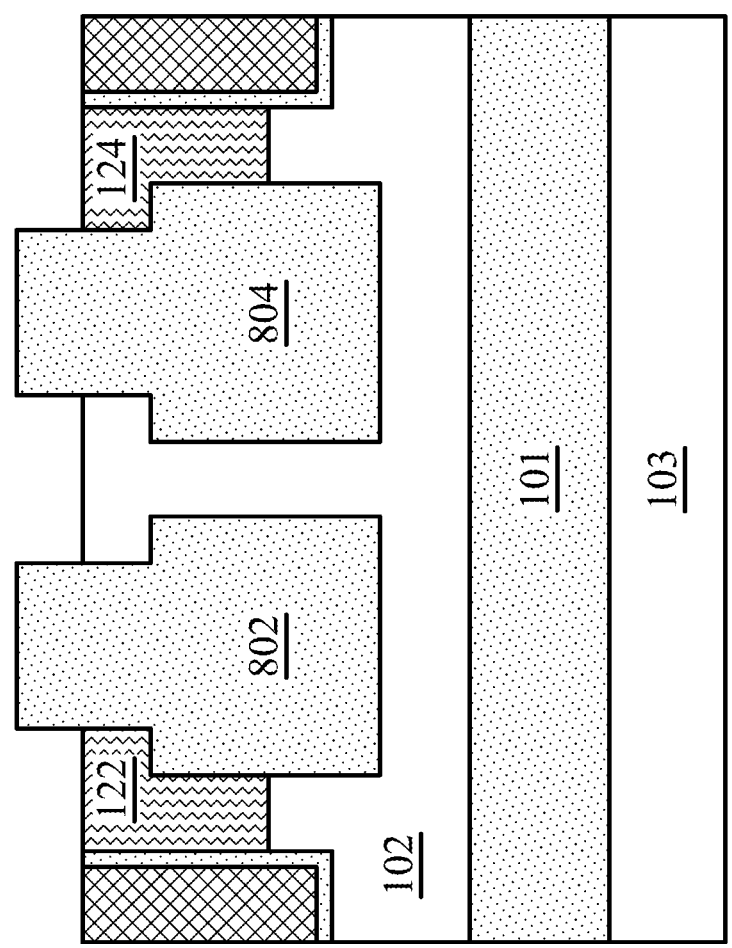
FIG. 14 illustrates a cross section view of the semiconductor device shown in FIG. 13 after body regions are formed in the substrate in accordance with an embodiment.

FIG. 14 illustrates a cross section view of the semiconductor device shown in FIG. 13 after body regions are formed in the substrate in accordance with an embodiment. Body regions 122 and 124 may be formed in the upper substrate portion 102. In accordance with an embodiment, when the upper substrate portion 102 is a lightly doped n-type substrate, the body regions 122 and 124 may be formed by implanting appropriate p-type dopants such as boron, gallium, indium or the like. Alternatively, in an embodiment in which the substrate 103 is an n-type substrate, the body regions 122 and 124 may be formed by implanting appropriate n-type dopants such as phosphorous, arsenic, or the like. In accordance with an embodiment, the doping density of the body regions 122 and 124 is in a range from about $10^{17}/cm^3$ to about $3 \times 10^{18}/cm^3$.

Figure 15:
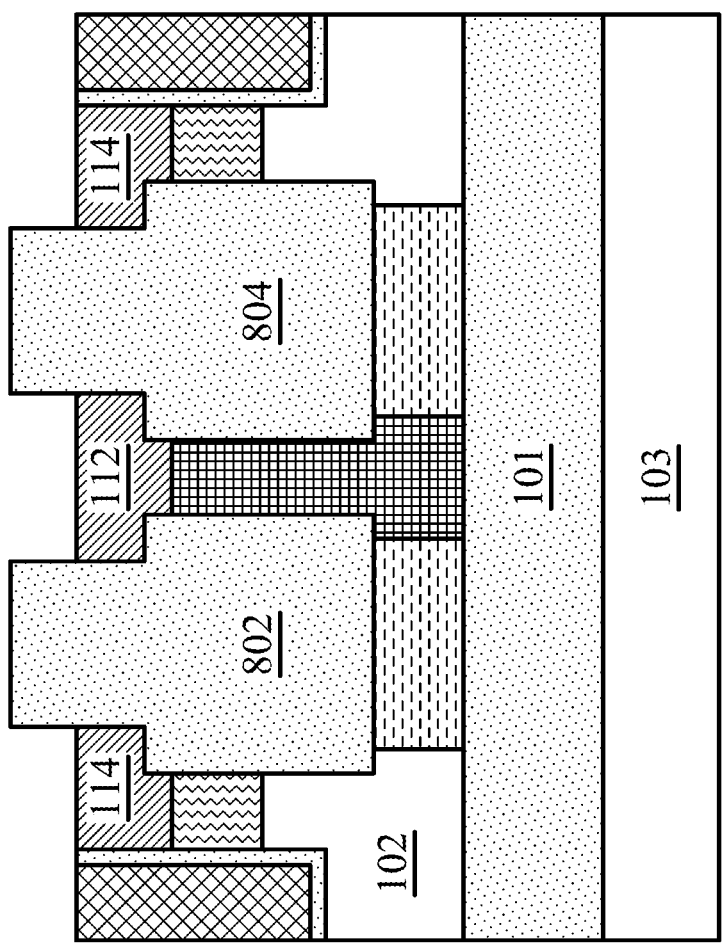
FIG. 15 illustrates a cross section view of the semiconductor device shown in FIG. 14 after drain/source regions are formed over the substrate in accordance with an embodiment.

FIG. 15 illustrates a cross section view of the semiconductor device shown in FIG. 14 after drain/source regions are formed over the substrate in accordance with an embodiment. The drain/source regions 112 and 114 may be formed on opposing sides of the isolation regions (e.g., isolation region 802). In accordance with an embodiment, the drain/source regions (e.g., drain/source region 112) may be formed by implanting appropriate n-type dopants such as phosphorous, arsenic, or the like. In accordance with an embodiment, the doping density of the drain/source regions (e.g., drain/source region 112) is in a range from about $10^{19}/cm^3$ to about $5 \times 10^{19}/cm^3$.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
an insulating layer buried in a substrate;
a body region in the substrate;
an isolation region in the substrate;
a first drain/source region over the body region;
a second drain/source region in the substrate, wherein the first drain/source region and the second drain/source region are on opposing sides of the isolation region;
a drift region comprising:
a first drift region of a first doping density formed between the second drain/source region and the insulating layer, wherein the first drift region comprises an upper portion surrounded by isolation regions and a lower portion, wherein a width of the lower portion of the first drift region is greater than a width of the upper portion of the first drift region; and
a second drift region of a second doping density formed between the isolation region and the insulating layer, wherein a height of the second drift region is equal to a height of the lower portion of the first drift region;
a first dielectric layer formed over the substrate; and
a gate formed over the first dielectric layer.

2. The structure of claim 1, wherein:
the first drain/source region is formed between the gate and the isolation region and the first drain/source region is in direct contact with a sidewall of the isolation region.

3. The structure of claim 1, wherein:
the first drain/source region is a source region; and
the second drain/source region is a drain region.

4. The structure of claim 1, wherein:
the isolation region comprises an upper portion between the first drain/source region and the second drain/source region, and a lower portion having a sidewall in direct contact with the upper portion of the first drift region.

5. The structure of claim 4, wherein:
a width of the lower portion of the isolation region is greater than a width of the second drift region.

6. The structure of claim 1, wherein:
the first doping density of the first drift region is greater than the second doping density of the second drift region.

7. The structure of claim 1, wherein:
the substrate is an N-type substrate;
the body region is a P-type region; and
the first drain/source region and the second drain/source region are N-type regions.

8. The structure of claim 1, wherein:
the first dielectric layer is between the gate and the first drain/source region.

9. A device comprising:
a first isolation region and a second isolation region in a substrate;
a drain region between the first isolation region and the second isolation region;
a first source region in a first body region over the substrate, wherein the first source region and the drain region are on opposing sides of the first isolation region;
a second source region in a second body region over the substrate, wherein the second source region and the drain region are on opposing sides of the second isolation region;
a first drift region of a first doping density, wherein an upper portion of the first drift region is between the first isolation region and the second isolation region;
a second drift region of a second doping density formed underneath the first isolation region;

a third drift region of a third doping density formed underneath the second isolation region;
a first gate adjacent to the first source region, wherein the first source region is between the first gate and the first isolation region and the first source region is in direct contact with a sidewall of the first isolation region; and
a second gate adjacent to the second source region.

10. The device of claim 9, further comprising:
an insulating layer buried in the substrate.

11. The device of claim 10, further comprising:
the second drift region is between the first isolation region and the insulating layer; and
the third drift region is between the second isolation region and the insulating layer.

12. The device of claim 9, further comprising:
a first dielectric layer between the first gate and the first source region; and
a second dielectric layer between the second gate and the second source region.

13. The device of claim 9, wherein:
the second source region is between the second gate and the second isolation region.

14. The device of claim 9, wherein:
a lower portion of the first drift region is between the second drift region and the third drift region.

15. A method comprising:
embedding an insulating layer in a substrate;
forming an isolation region over the insulating layer;
forming a body region over the insulating layer in the substrate;
implanting ions to form a first drift region and a second drift region, wherein:
the first drift region is of a first doping density and between a drain region and the insulating layer; and
the second drift region is of a second doping density and between the isolation region and the insulating layer;
implanting ions to form the drain region and a source region, wherein the source region and the drain region are on opposing sides of the isolation region; and
forming a gate structure adjacent to the source region, wherein the source region is formed between the gate structure and the isolation region, and wherein the source region is in direct contact with a sidewall of the isolation region.

16. The method of claim 15, further comprising:
forming a dielectric layer between the gate structure and the source region.

17. The method of claim 15, wherein:
the first drift region has a higher doping density than the second drift region.

18. The method of claim 15, wherein:
a bottom surface of the body region is higher than a bottom surface of the gate structure;
the bottom surface of the body region is higher than a bottom surface of the isolation region; and
the bottom surface of the gate structure is higher than the bottom surface of the isolation region.

* * * * *